(12) United States Patent
Beissert et al.

(10) Patent No.: US 12,114,449 B2
(45) Date of Patent: Oct. 8, 2024

(54) HOUSING MODULE AND FIELD DEVICE

(71) Applicant: Endress+Hauser Flowtec AG, Reinach (CH)

(72) Inventors: Markus Beissert, Auggen (DE); Harald Müller, Fulda (DE); Marc Fiedler, Reinach (CH)

(73) Assignee: Endress+Hauser Flowtec AG, Reinach (CH)

( * ) Notice: Subject to any disclaimer, the term of this patent is extended or adjusted under 35 U.S.C. 154(b) by 475 days.

(21) Appl. No.: 17/626,189

(22) PCT Filed: Jun. 18, 2020

(86) PCT No.: PCT/EP2020/066958
§ 371 (c)(1),
(2) Date: Jan. 11, 2022

(87) PCT Pub. No.: WO2021/004754
PCT Pub. Date: Jan. 14, 2021

(65) Prior Publication Data
US 2022/0256723 A1 Aug. 11, 2022

(30) Foreign Application Priority Data
Jul. 11, 2019 (DE) .......................... 102019118778.8

(51) Int. Cl.
*H05K 5/02* (2006.01)
*G01D 11/24* (2006.01)
*H01B 17/26* (2006.01)

(52) U.S. Cl.
CPC ......... *H05K 5/0247* (2013.01); *G01D 11/245* (2013.01); *H01B 17/26* (2013.01)

(58) Field of Classification Search
CPC .... G01D 11/245; H05K 5/0247; H01B 17/26; H01B 7/29; H01B 7/292; H01B 7/295
See application file for complete search history.

(56) References Cited

U.S. PATENT DOCUMENTS 7,014,502 B2  3/2006  Rasmussen
2009/0315278 A1  12/2009  DiRienzo, Jr. et al.
(Continued)

FOREIGN PATENT DOCUMENTS

CN  108112277 A  3/2008
CN  201038515 Y  3/2008
(Continued)

*Primary Examiner* — Paul M. West
(74) *Attorney, Agent, or Firm* — Christopher R. Powers; Endress+Hauser (USA) Holding, Inc.

(57) ABSTRACT

A housing module includes a housing including a housing wall, a first housing chamber and a second housing chamber separated by a partition wall, wherein: the partition wall has a through-opening for an electrical feedthrough for connecting measurement/operating electronics to interface electronics; the feedthrough satisfying requirements of an Ex-d standard; the feedthrough having an electrically insulating carrier body and a plurality of electrically conductive connecting devices for providing the electrical connection, which connecting devices extend through holes in the carrier body; the holes each having a first dimension along a hole axis and each having an inner diameter; the connecting devices each having an outer diameter; the carrier body being inserted into the through-opening from a side of the partition wall facing the first housing chamber, and forming a flame arrestor according to the Ex-d standard.

12 Claims, 4 Drawing Sheets

(56) References Cited

U.S. PATENT DOCUMENTS

| | | |
|---|---|---|
| 2011/0317390 A1 | 12/2011 | Moser et al. |
| 2012/0260738 A1 | 10/2012 | Thomas |
| 2015/0377659 A1* | 12/2015 | Landis ............... G01N 33/0057 |
| | | 73/431 |
| 2019/0063964 A1 | 2/2019 | Wolff et al. |

FOREIGN PATENT DOCUMENTS

| | | |
|---|---|---|
| CN | 105474472 A | 4/2016 |
| DE | 10126654 A1 | 12/2002 |
| DE | 102014106540 A1 | 11/2015 |
| DE | 102017128755 A1 | 6/2019 |
| EP | 1130363 A1 | 9/2001 |
| EP | 2642255 A2 | 9/2013 |
| JP | 2001003901 A | 1/2001 |
| WO | 2011160949 A1 | 12/2011 |

* cited by examiner

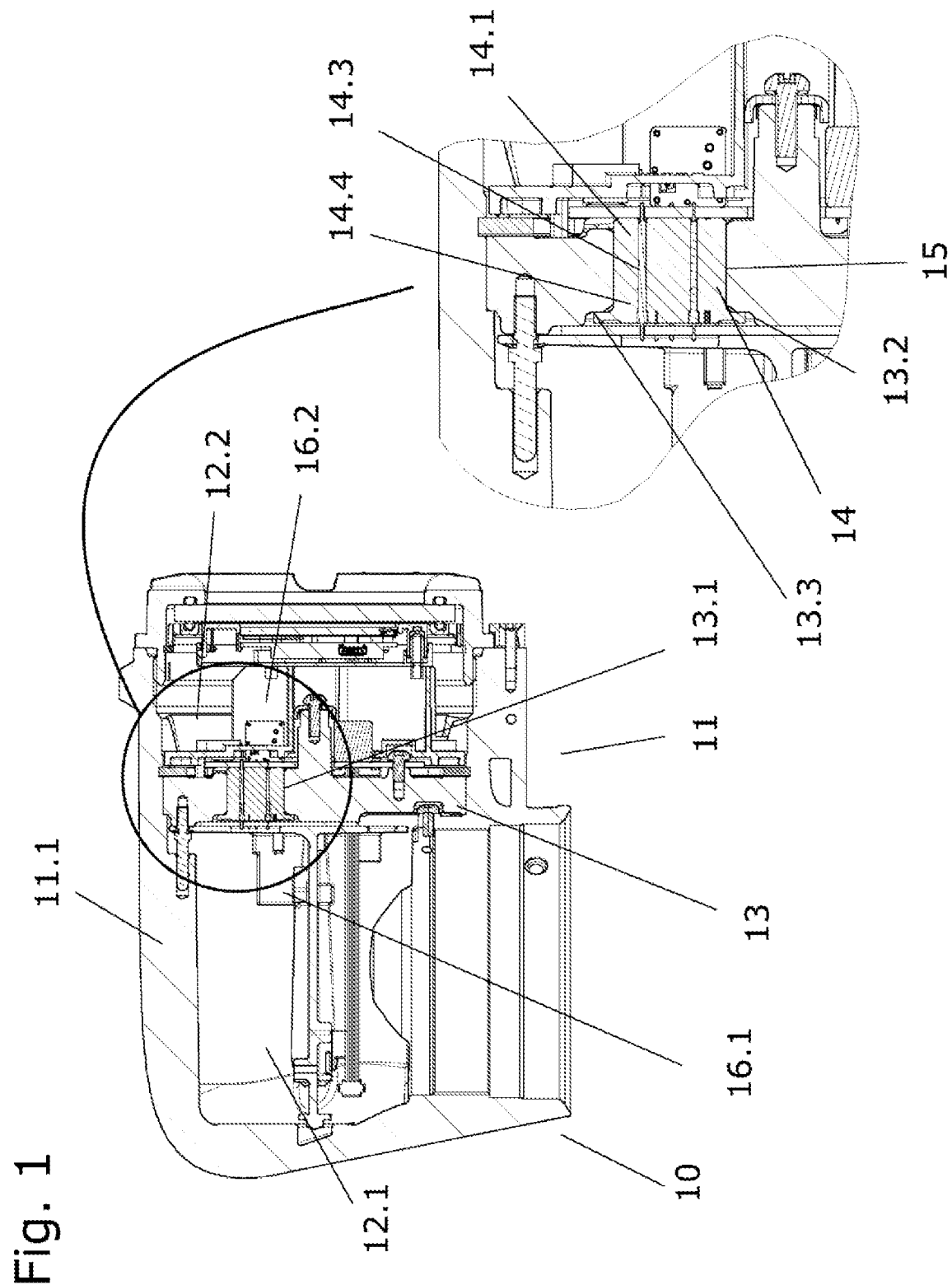

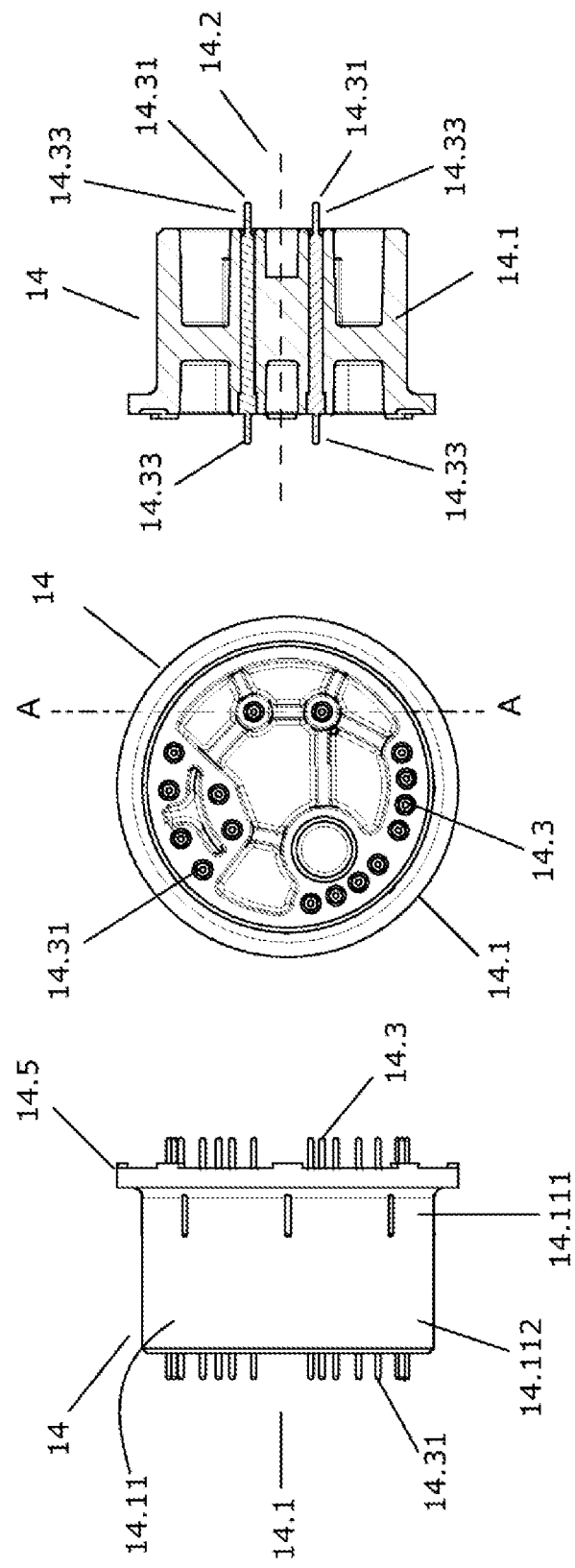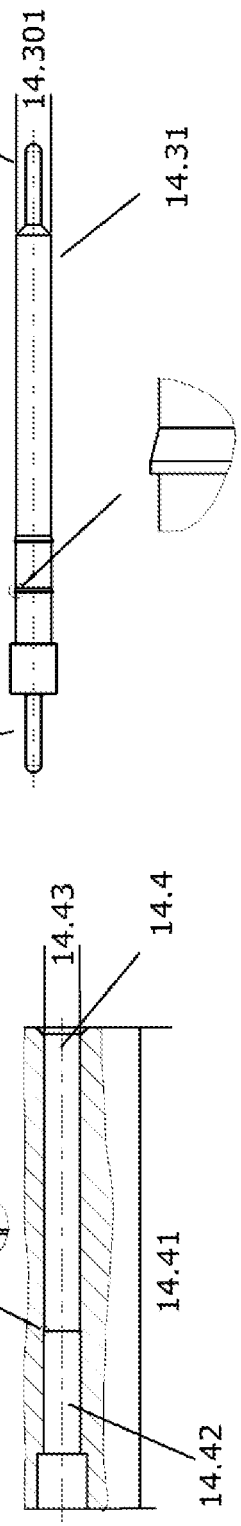

HOUSING MODULE AND FIELD DEVICE

CROSS-REFERENCE TO RELATED APPLICATIONS

The present application is related to and claims the priority benefit of German Patent Application No. 10 2019 118 778.8, filed on Jul. 11, 2019, and International Patent Application No. PCT/EP2020/066958, filed Jun. 18, 2020, the entire contents of which are incorporated herein by reference.

TECHNICAL FIELD

The invention relates to a housing module of a field device using measurement and automation technology and to such a field device, wherein the housing module has at least two housing chambers, wherein the housing chambers are separated by a partition wall, wherein the housing module satisfies ignition protection type Ex-d.

BACKGROUND

WO2011160949A1 discloses such a housing module having such a separation wall, wherein a measurement/operating electronics unit is arranged in a first housing chamber, and wherein an interface electronics unit is arranged in a second housing chamber. An electrical connection is guided through an opening in the separating wall, wherein the opening is filled with a casting compound in order to satisfy requirements with regard to ignition protection type Ex-d.

Equipping with a casting compound is complex and retards production, since a casting compound must harden before subsequent manufacturing steps can be carried out. Replacing the electrical connection or accessing the measurement/operating electronics unit for inspection or replacement is also made more difficult.

SUMMARY

The aim of the invention is therefore to propose a housing module and a field device with such a housing module, in which manufacturing and also maintenance are simplified while complying with the requirements of ignition protection type Ex-d.

The aim is achieved by a housing module and by a field device according to the present disclosure.

A housing module according to the invention of a field device using measurement and automation technology comprises:
- a housing with a housing wall and a first housing chamber and also a second housing chamber, said housing chambers being separated by a partition wall that is in particular releasably fastened,
- wherein a measurement/operating electronics unit of the field device is arranged in the first housing chamber, and wherein an interface electronics unit for connecting lines for supplying power to the field device and/or for exchanging data is arranged in the second housing chamber,
- wherein the partition wall has a through-opening, which through-opening has an electrical feedthrough for connecting the measurement/operating electronics unit to the interface electronics unit,
- wherein the feedthrough requirements correspond to the Ex-d standard according to IEC60079-1 of 2014-06; EN60079-1 of 2014-06,
- wherein the feedthrough has an electrically-insulating carrier body with a longitudinal axis and several electrically-conductive connecting devices for providing the electrical connection, which connecting device runs through holes or through-holes in the carrier body,
- wherein the holes each have a first dimension along a hole axis and an inner diameter, wherein the connecting devices each have an outer diameter,
- wherein the connecting device is held in a positive-locking manner in the carrier body in the direction of the second housing chamber on a side, facing the first housing chamber, of the carrier body,
- wherein a ratio of a difference between the inner diameter of the hole and the outer diameter of the associated connecting device to the first dimension is less than 0.05, and especially is less than 0.025 and preferably is less than 0.02,
- wherein the carrier body is inserted into the passage opening from a side, facing the first housing chamber, of the partition wall and forms a flame arrestor in accordance with the Ex-d standard.

In one embodiment, at least one connecting device is one of the following:
- a pin, in particular a metal pin;
- a high-frequency through-line,
- wherein the pin or the high-frequency through-line comprises contacting elements for contact with the electronic measurement/operating circuit and the interface electronics unit.

In one embodiment, the high-frequency line has an electrically-conductive sleeve, an inner conductor arranged in the sleeve, and an electrical insulation, which electrical insulation electrically separates the inner conductor from the sleeve,
- wherein the electrical insulation comprises a dielectric, such as PTFE.

Here, the electrical insulation should meet the requirements of the IEC60079-0, IEC60079-7, and IEC60079-11 standards and also of the EN60079-0, EN60079-7, and EN60079-11 standards.

In one embodiment, an inner wall of the through-opening is separated from a lateral surface, located in the through-opening, of the carrier body by a gap surrounding the carrier body,
- wherein the gap has a gap width measured by an average distance between the lateral surface and the inner wall of the through-opening, and wherein the gap has a path length in a plane containing a longitudinal section of the carrier body,
- wherein a ratio of gap width to path length is less than 0.05, and in particular less than 0.025 and preferably less than 0.02.

In one embodiment, the carrier body has a shoulder on a side facing the first housing chamber, which shoulder is suitable for establishing a positive-locking connection to an edge of the through-opening,
- wherein the shoulder is suitable for holding the carrier body in a pressure-bearing manner.

In one embodiment, the edge of the through-opening is a recess in the partition wall, which fully accommodates the shoulder in the direction of the longitudinal axis of the carrier body.

In one embodiment, a section, facing the first housing chamber, of the lateral surface located in the through-opening has a first circumference, wherein a section, facing the second housing chamber, of the lateral surface located in the through-opening has a second circumference, wherein the first circumference is greater than the second circumference.

In one embodiment, the carrier body is produced from a plastic, in particular by means of injection molding.

In one embodiment, the connecting devices are pressed into the holes.

In one embodiment, the external diameter of the connecting devices varies along a longitudinal axis of the connecting device.

In one embodiment, the partition wall is inserted into the housing so that the two housing chambers are formed when the partition wall is inserted.

A field device using measurement and automation technology according to the invention comprises:

a housing module as described above;
a measuring transducer for detecting at least one measurand, and for providing a measurement signal representing the measurand,
wherein the electronic measurement/operating electronics unit is designed to determine and provide measured values of the measurand by means of the measurement signal.

BRIEF DESCRIPTION OF THE DRAWINGS

The invention will now be described with reference to exemplary embodiments.

FIG. 1 illustrates a cross-section through an exemplary housing module according to the present disclosure;

FIGS. 2a-2c illustrate an exemplary electrical feedthrough according to the present disclosure together with a carrier body with connecting devices;

DETAILED DESCRIPTION

Figure 3:
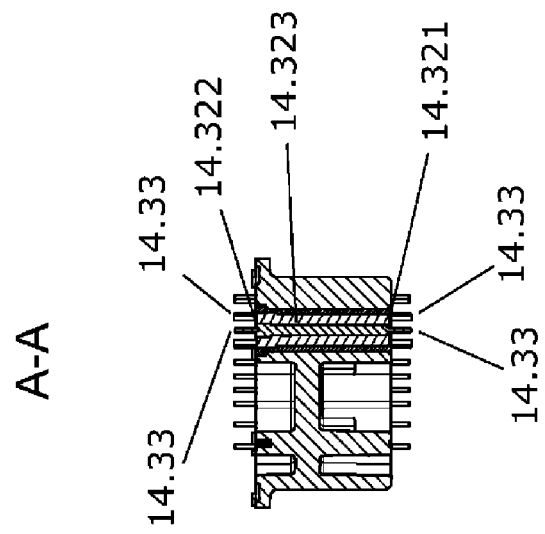
FIGS. 3a-3c illustrate an exemplary electrical feedthrough according to the present disclosure together with a carrier body with connecting devices.
Figure 3:
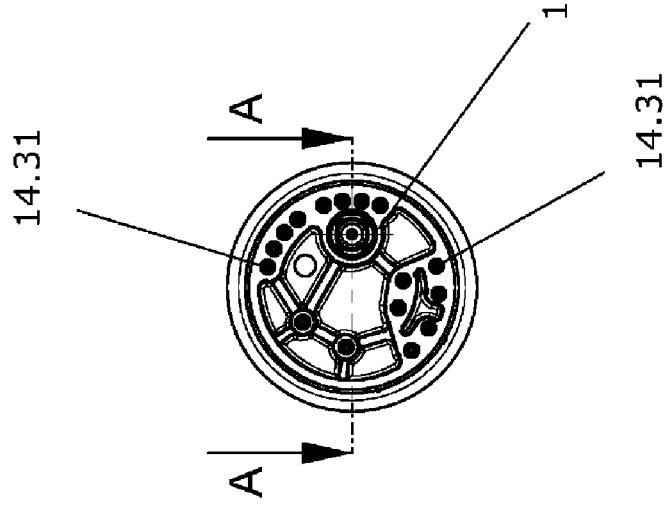
Figure 3:
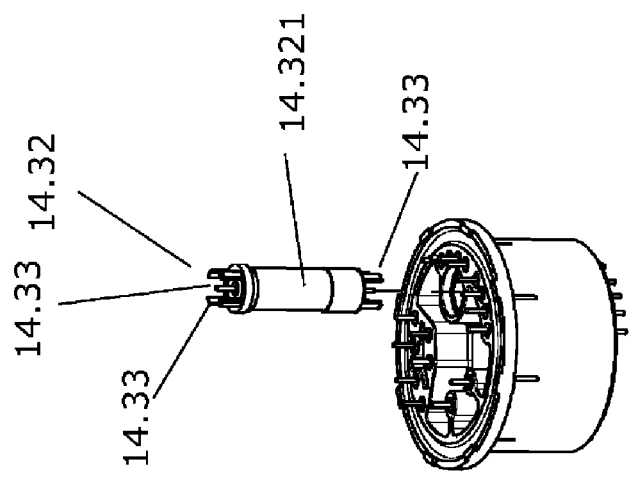

FIG. 1 illustrates a cross-section through a housing module 10 of a field device 1 using measurement and automation technology with a housing 11 having a housing wall 11.1, which housing comprises a first housing chamber 12.1 and a second housing chamber 12.2, which are separated by a partition wall 13. The partition wall has a through-opening 13.1.

A measurement/operating electronics unit 16.1 is arranged in the first housing chamber 12.1, and an interface electronics unit 16.2 is arranged in the second housing chamber. The measurement/operating electronics unit is configured to acquire measurement signals of a measuring transducer and to provide measured values for a measurand represented by the measurement signals. The interface electronics unit is configured, for example, to enable measured values to be read out or a supply line to be connected. The measurement/operating electronics unit and the interface electronics unit are connected by means of an electrical feedthrough 14, which electrical feedthrough is arranged in the through-opening.

The separation of the first housing chamber from the second housing chamber satisfies the Ex-d standard according to IEC60079-1 of 2014-06; EN60079-1 of 2014-06, wherein the partition wall as well as the electrical feedthrough inserted into the through-opening form a flame arrestor.

The electrical feedthrough 14 has an electrically-insulating carrier body 14.1 with a longitudinal axis 14.2 and a lateral surface 14.11, wherein the carrier body as shown here can have a shoulder 14.5 on a side facing the first housing chamber, which shoulder is suitable for forming a positive-locking connection to an edge 13.2 of the through-opening, wherein the shoulder is configured to hold the carrier body in a pressure-bearing manner. As shown here, the shoulder can be countersunk in a recess 13.3 in the partition wall, which recess forms the edge 13.2. The carrier body also has holes 14.4 in which electrically-conductive connecting devices 14.3 are arranged for connecting the electronic measurement/operating circuit 16.1 to the interface electronics unit 16.2.

According to the invention, a ratio of a difference between an inner diameter 14.43 of the hole and outer diameter 14.301 of the associated connecting device to a first dimension 14.41 of the hole along a hole axis 14.42 is less than 0.05, and in particular is less than 0.025 and preferably is less than 0.02; see also FIG. 2 b). In this way, with regard to the connecting devices, the carrier body forms a flame arrestor in accordance with the Ex-d standard.

In one embodiment, the carrier body is separated from the partition wall by a gap, wherein a ratio of a gap width to a gap length is less than 0.05, and in particular is less than 0.025 and preferably is less than 0.02. The gap width is measured by an average distance between the lateral surface and the inner wall of the through-opening, wherein the gap has a path length in a plane containing a longitudinal section of the carrier body, wherein the path length measures the gap length.

FIG. 2 a) shows, from left to right, a side view in detail of an exemplary electrical feedthrough 14 according to the invention as schematically illustrated in FIG. 1, with a carrier body 14.1; a top view of the feedthrough; and a section through the feedthrough along the plane A indicated in the top view. The carrier body has a longitudinal axis 14.2, wherein a connecting element 14.1 for electrically connecting the measurement/operating electronics unit 16.1 to the interface electronics unit 16.2 is arranged in holes 14.4 of the carrier body in each case. In this exemplary embodiment, the connecting elements are electrically-conductive pins 14.31, in particular metal pins, which are pressed into the holes. Since the ratio of the difference between the inner diameter of the hole and the outer diameter of the connecting device—in this case a pin—to the first dimension is less than 0.05, and in particular is less than 0.025 and preferably is less than 0.02, there is a fit between the pin and the hole. A flame front arising in the first housing chamber cannot penetrate as far as the second housing chamber, such that the connecting elements in the holes form a flame arrestor in accordance with the Ex-d standard.

As shown here, a lateral surface 14.11 of the carrier body can have a larger circumference in a section 14.111 that is to face the first housing chamber than in a second section 14.112. As shown here, the larger circumference can be provided by means of ribs or by a circumferential, continuous widening of the carrier body. In this way, the carrier body can easily be inserted into the housing wall via a clearance fit, which clearance fit transitions into a press fit, for example.

As shown in the plan view, the connecting devices 14.3 can be arranged in several groups in order to, for example, disconnect intrinsically safe connections (in accordance with IEC60079-11) for transmitting increased power from other, non-intrinsically safe connections.

FIG. 2 b) shows a detailed section through the carrier body along a hole 14.4. The hole can, along the hole axis 14.42, have a inner diameter 14.43 that varies. If the pin, as shown in FIG. 2 c), has, along a longitudinal axis, an outer diameter 14.301 that varies, said outer diameter 14.301 being complementary to the inner diameter 14.43 at least in sections, then it will be possible to place the pin precisely in the hole.

The connecting devices 14.3—here, pins—have contacting elements 14.33 for electrical contact with the measurement/operating electronics unit 16.1 and with the interface electronics unit 16.2.

FIGS. 3 a) through c) show, from left to right, a side view in detail of an exemplary electrical feedthrough 14 according to the invention as shown schematically in FIG. 1, with a carrier body 14.1, a top view of the feedthrough, and a section through the feedthrough along plane A indicated in the top view.

In contrast to the feedthrough shown in FIGS. 2 a) through c), the feedthrough has a high-frequency through-line 14.32. A high-frequency through-line comprises a sleeve 14.321, an inner conductor 14.322 which runs in particular coaxially to the sleeve, and an electrical insulation 14.323 for the electrical separation of the sleeve and inner conductor. The statements made in FIGS. 2 a) through 2 c) also apply to the embodiment shown in FIG. 3.

Figure 4:
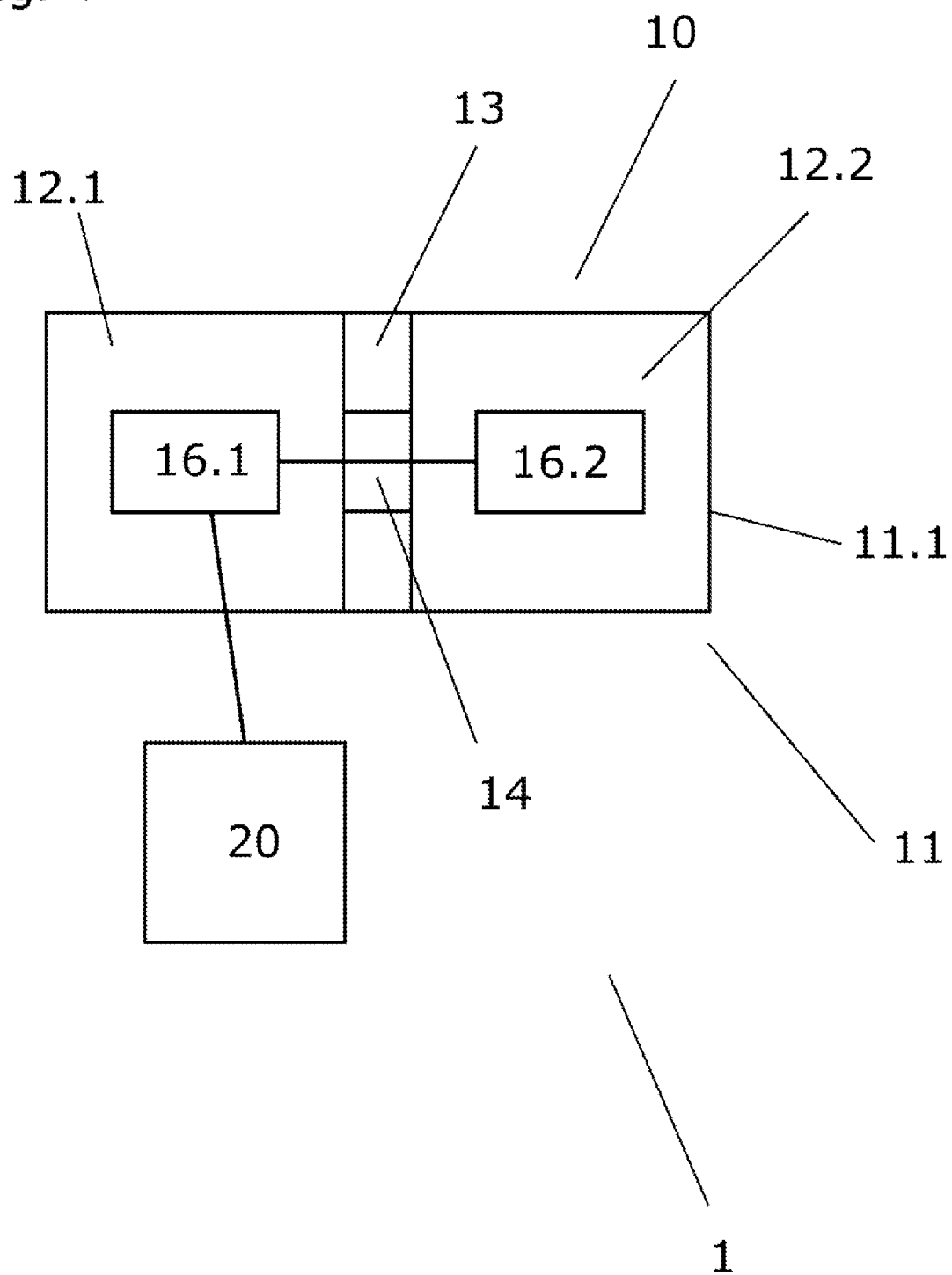
FIG. 4 shows a schematic structure of a field device with a housing module according to the present disclosure together with a carrier body with connecting devices.

FIG. 4 illustrates a schematic exemplary structure of a field device 1 using measurement and automation technology, which has a housing module 10 according to the invention with a housing 11, which housing is formed by a housing wall 11.1. The housing module has a first housing chamber 12.1 and a second housing chamber 12.2, which are separated by a partition wall 13. The partition wall can be set up to be releasably fastened. An electronic measurement/operating circuit 16.1 is arranged in the first housing chamber and is configured to operate a measuring transducer 20 of the field device, and an interface electronics unit 16.2 is arranged in the second housing chamber. A feedthrough 14 according to the invention as described above is configured to electrically connect the measurement/operating electronics unit to the interface electronics unit.

The invention claimed is:

1. A housing module of a field device configured for measurement and automation technology, the housing module comprising:
    a housing including a housing wall, which defines a first housing chamber and a second housing chamber, wherein the first housing chamber and the second housing chamber are separated by a partition wall, which is releasably fastened;
    a measurement/operating electronics unit disposed in the first housing chamber; and
    an interface electronics unit disposed in the second housing chamber and configured to enable connecting lines for supplying power to the field device and/or for exchanging data,
    wherein the partition wall includes a through-opening in which an electrical feedthrough is disposed, wherein the electrical feedthrough is configured to enable an electrical connection between the measurement/operating electronics unit and the interface electronics unit and to satisfy requirements of an Ex-d standard according to IEC60079-1 of 2014-06 and EN60079-1 of 2014-06,
    wherein the electrical feedthrough includes an electrically-insulating carrier body having a longitudinal axis and a plurality of electrically-conductive connecting devices configured to enable the electrical connection, the plurality of connecting devices extending through corresponding holes or through-openings in the carrier body,
    wherein the corresponding holes each have a first dimension along a hole axis and an inner diameter, wherein the plurality of connecting devices each have an outer diameter,
    wherein the plurality of connecting devices are held in the carrier body in a positive-locking manner in a direction of the second housing chamber on a side of the carrier body facing the first housing chamber,
    wherein a ratio of a difference between the inner diameter of the corresponding hole and the outer diameter of the corresponding connecting device to the first dimension is less than 0.05,
    wherein the carrier body is configured to be inserted into the through-opening from a side of the partition wall facing the first housing chamber as to form a flame arrestor in accordance with the Ex-d standard.

2. The housing module of claim 1, wherein at least one of the plurality of connecting device is one of the following:
    a metal pin; and
    a high-frequency through-line,
    wherein the pin or the high-frequency through-line includes contacting elements adapted to contact the electronic measurement/operating circuit and the interface electronics unit.

3. The housing module of claim 2, wherein the high-frequency line includes an electrically-conductive sleeve, an inner conductor disposed in the sleeve, and an electrical insulation that electrically separates the inner conductor from the sleeve, wherein the electrical insulation comprises a dielectric.

4. The housing module of claim 1, wherein an inner wall of the through-opening is separated from a lateral surface, located in the through-opening, of the carrier body by a gap surrounding the carrier body,
    wherein the gap has a gap width defined by an average distance between the lateral surface and the inner wall of the through-opening, and wherein the gap has a path length in a plane containing a longitudinal section of the carrier body,
    wherein a ratio of gap width to path length is less than 0.05.

5. The housing module of claim 4, wherein the carrier body includes a shoulder on a side facing the first housing chamber, which shoulder is configured to form a positive-locking connection to an edge of the through-opening, wherein the shoulder is configured to hold the carrier body in a pressure-bearing manner.

6. The housing module of claim 5, wherein the edge of the through-opening is a recess in the partition wall which fully accommodates the shoulder in a direction of the longitudinal axis of the carrier body.

7. The housing module of claim 4, wherein a first section, facing the first housing chamber, of the lateral surface located in the through-opening has a first circumference,
    wherein a second section, facing the second housing chamber, of the lateral surface located in the through-opening has a second circumference, and
    wherein the first circumference is greater than the second circumference.

8. The housing module of claim 1, wherein the carrier body an injection molded plastic.

9. The housing module of claim 8, wherein the plurality of connecting devices are pressed into the holes.

10. The housing module of claim 9, wherein the outer diameter of each connecting devices varies along a longitudinal axis of the connecting device.

11. The housing module of claim 1, wherein the partition wall is introduced into the housing such that the first and second housing chambers are defined in part by the partition wall.

12. A field device of measurement and automation technology, comprising:
- a housing module according to claim 1; and
- a measuring transducer configured to detect at least one measurand and to generate a measurement signal representing the measurand, wherein the electronic measurement/operating electronics unit is configured to determine and generate measured values of the measurand based on the measurement signal.

\* \* \* \* \*